United States Patent
Lin et al.

(10) Patent No.: US 8,703,546 B2
(45) Date of Patent: Apr. 22, 2014

(54) ACTIVATION TREATMENTS IN PLATING PROCESSES

(75) Inventors: Chih-Wei Lin, Xinfeng Township (TW); Ming-Da Cheng, Jhubei (TW); Ming-Che Ho, Tainan (TW); Chung-Shi Liu, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 526 days.

(21) Appl. No.: 12/784,314

(22) Filed: May 20, 2010

(65) Prior Publication Data

US 2011/0287628 A1     Nov. 24, 2011

(51) Int. Cl.
*H01L 21/82*     (2006.01)
*H01L 21/288*     (2006.01)

(52) U.S. Cl.
CPC .................. *H01L 21/288* (2013.01)
USPC .................. 438/129; 257/E21.502

(58) Field of Classification Search
CPC ....................................... H01L 21/288
USPC ........................................... 438/129
See application file for complete search history.

(56) References Cited

U.S. PATENT DOCUMENTS

| | | | |
|---|---|---|---|
| 3,558,441 A * | 1/1971 | Chadwick et al. | 205/126 |
| 5,975,976 A * | 11/1999 | Sekinger et al. | 445/50 |
| 6,396,148 B1 * | 5/2002 | Eichelberger et al. | 257/758 |
| 6,492,197 B1 * | 12/2002 | Rinne | 438/108 |
| 2003/0113955 A1 * | 6/2003 | Kim et al. | 438/125 |
| 2004/0007779 A1 * | 1/2004 | Arbuthnot et al. | 257/780 |
| 2004/0118692 A1 * | 6/2004 | Chen et al. | 205/125 |
| 2004/0178503 A1 * | 9/2004 | Jin et al. | 257/737 |
| 2005/0032349 A1 * | 2/2005 | Lee et al. | 438/614 |
| 2005/0084615 A1 * | 4/2005 | Weidman et al. | 427/305 |
| 2005/0101130 A1 * | 5/2005 | Lopatin et al. | 438/678 |
| 2005/0181226 A1 * | 8/2005 | Weidman et al. | 428/544 |
| 2006/0225918 A1 * | 10/2006 | Chinda et al. | 174/260 |
| 2006/0252252 A1 * | 11/2006 | Zhu et al. | 438/618 |
| 2007/0218590 A1 * | 9/2007 | Kameyama | 438/123 |
| 2007/0235218 A1 * | 10/2007 | Miyamoto et al. | 174/261 |
| 2007/0268675 A1 * | 11/2007 | Chinda et al. | 361/748 |
| 2008/0116077 A1 * | 5/2008 | Sricharoenchaikit | 205/148 |
| 2008/0201943 A1 * | 8/2008 | Chinda et al. | 29/837 |

* cited by examiner

*Primary Examiner* — Matthew Landau
*Assistant Examiner* — Igwe U Anya
(74) *Attorney, Agent, or Firm* — Slater & Matsil, L.L.P.

(57) ABSTRACT

A method of forming a device includes performing a first plating process to form a first metallic feature, and performing an activation treatment to a surface of the first metallic feature in an activation treatment solution, wherein the activation treatment solution includes a treatment agent in deionized (DI) water. After the step of performing the activation treatment, performing a second plating process to form a second metallic feature and contacting the surface of the first metallic feature.

11 Claims, 4 Drawing Sheets

US 8,703,546 B2

ACTIVATION TREATMENTS IN PLATING PROCESSES

TECHNICAL FIELD

This disclosure relates generally to integrated circuits, and more particularly to plating processes, and even more particularly to bump formation processes using plating processes.

BACKGROUND

In the formation of a semiconductor chip, integrated circuit devices, such as transistors, are first formed at the surface of a semiconductor substrate in the semiconductor chip. Interconnect structures are then formed over the integrated circuit devices. Bumps are formed on the surface of the semiconductor chip so that the integrated circuit devices can be accessed.

In a typical bump formation process, an under-bump metallurgy (UBM) is formed, followed by the formation of a bump on the UBM. The UBM formation may include forming a copper seed layer and forming and patterning a mask on the copper seed layer so that a portion of the copper seed layer is exposed through an opening in the mask. A plating step is then performed to plate a thick copper layer on the exposed portion of the copper seed layer. Subsequently, additional layers, such as a nickel layer and a solder layer may be plated successively. Conventionally, between each of the plating processes, a quick dump rinse (QDR) is performed using de-ionized (DI) water to clean the surfaces of the plated layers.

It was found that the interfaces between the plated layers were rough, with voids formed therein. As a consequence, the electro-migration (EM) performance, and hence the reliability, of the resulting bumps is degraded.

SUMMARY

In accordance with one aspect, a method of forming a device includes performing a first plating process to form a first metallic feature, and performing an activation treatment to a surface of the first metallic feature in an activation treatment solution, wherein the activation treatment solution includes a treatment agent in de-ionized (DI) water. After the step of performing the activation treatment, performing a second plating process to form a second metallic feature and contacting the surface of the first metallic feature.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel integrated circuit formation process is provided in accordance with an embodiment. The intermediate stages of manufacturing an embodiment are illustrated. The variations of the embodiment are discussed. Throughout the various views and illustrative embodiments, like reference numbers are used to designate like elements.

Figure 1:
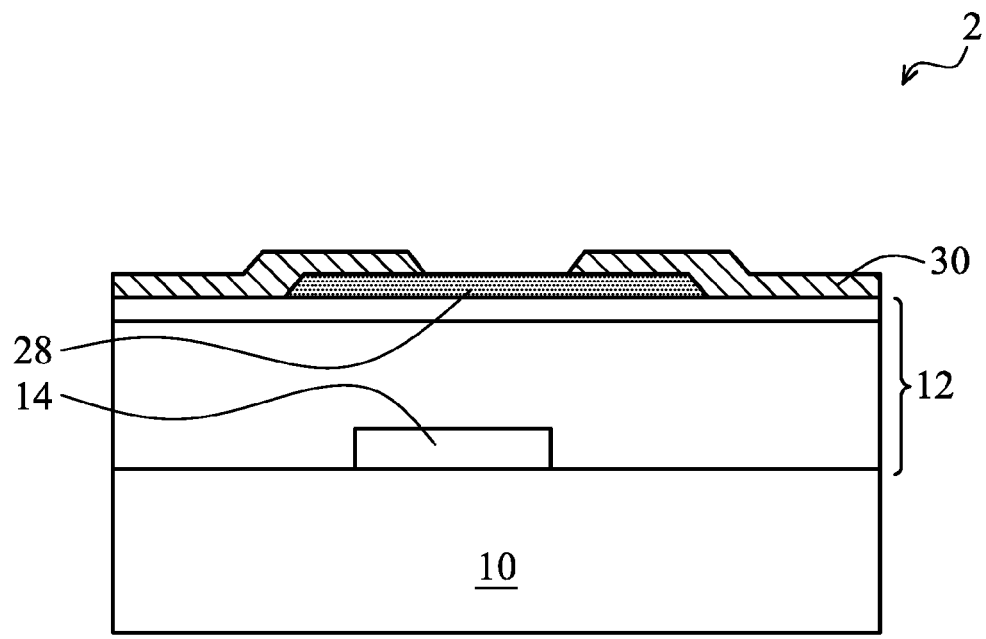
FIGS. 1 through 7 are cross-sectional views of intermediate stages in the manufacturing of a metal bump in accordance with an embodiment.

Referring to FIG. 1, wafer 2, which includes substrate 10, is provided. Substrate 10 may be a semiconductor substrate, such as a bulk silicon substrate, although it may include other semiconductor materials, such as silicon germanium, silicon carbide, gallium arsenide, or the like. Semiconductor devices 14, such as transistors, may be formed at the surface of substrate 10. Interconnect structure 12, which includes metal lines and vias (not shown) formed therein and connected to semiconductor devices 14, is formed over substrate 10. The metal lines and vias may be formed of copper or copper alloys and may be formed using the well-known damascene processes. Interconnect structure 12 may include inter-layer dielectrics (ILDs) and inter-metal dielectrics (IMDs). In alternative embodiments, wafer 2 is an interposer wafer or a package substrate, and is substantially free from integrated circuit devices, including devices, such as transistors, resistors, capacitors, inductors, and/or the like formed therein. In these embodiments, substrate 10 may be formed of a semiconductor material or a dielectric material, such as silicon oxide.

Metal pad 28 is formed over interconnect structure 12. Metal pad 28 may comprise aluminum, copper (Cu), silver (Ag), gold (Au), nickel (Ni), tungsten (W), alloys thereof, and/or multi-layers thereof. Metal pad 28 may be electrically coupled to semiconductor devices 14, for example, through the underlying interconnection structure 12. Passivation layer 30 may be formed to cover edge portions of metal pad 28. In an exemplary embodiment, passivation layer 30 is formed of polyimide or other known dielectric materials, such as silicon oxide, silicon nitride, and multi-layers thereof.

Figure 2:
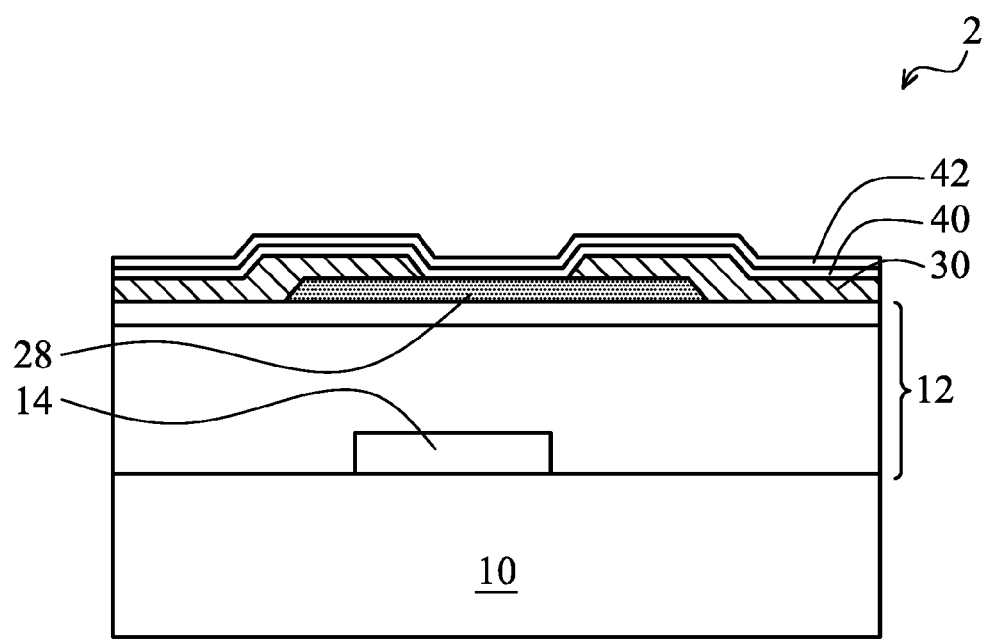

Referring to FIG. 2, an under-bump metallurgy (UBM), which may include diffusion barrier layer 40 (which is optional) and seed layer 42, is blanket formed. Diffusion barrier layer 40 may be a titanium layer, a titanium nitride layer, a tantalum layer, or a tantalum nitride layer. The materials of seed layer 42 may include copper or copper alloys, and hence is alternatively referred to as copper seed layer 42 hereinafter. However, other metals, such as silver, gold, aluminum, and combinations thereof, may also be included. In an embodiment, diffusion barrier layer 40 and copper seed layer 42 are formed using physical vapor deposition or other applicable methods.

Figure 3:
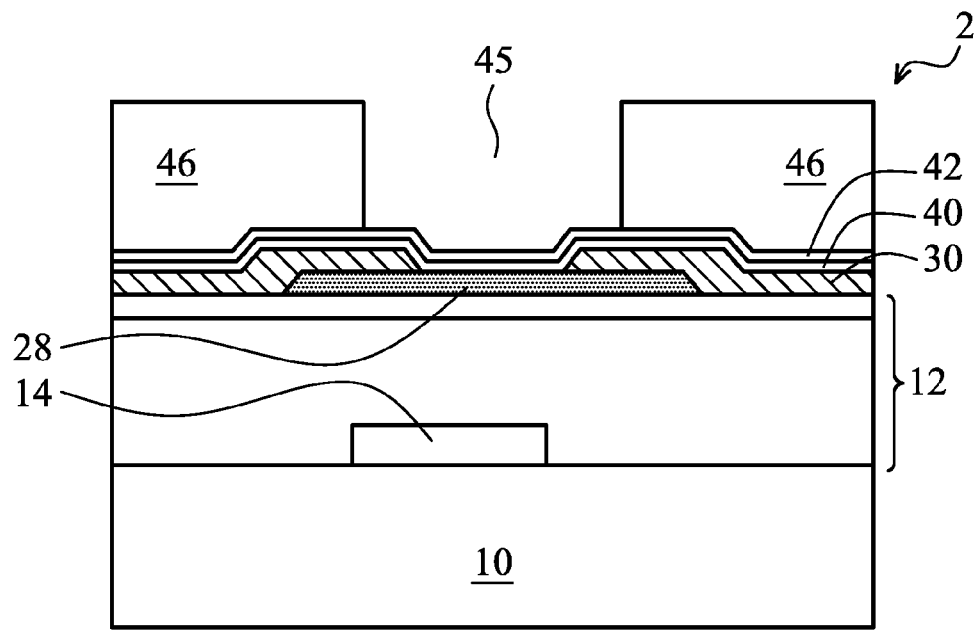
Figure 4:
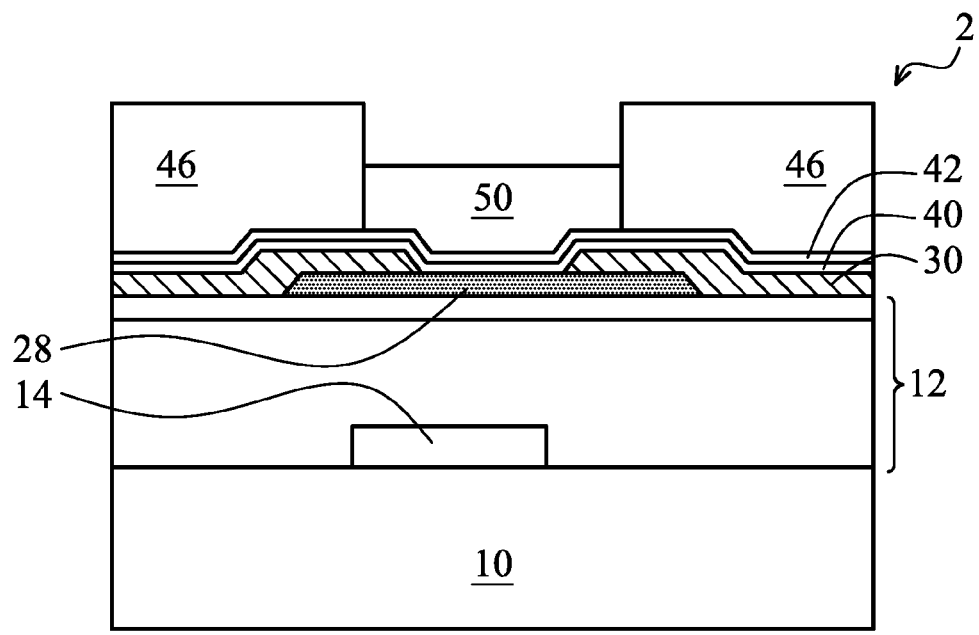

FIG. 3 illustrates the formation of mask 46, which may be formed of a photo resist, for example. Accordingly, copper seed layer 42 is exposed through opening 45 in mask 46. Next, wafer 2 is placed into a plating solution (not shown), and a plating is performed to form first metallic feature 50 on UBM 40/42 and opening 45, as shown in FIG. 4. The plating may be an electro-plating, an electroless-plating, an immersion plating, or the like. In an embodiment, first metallic layer 50 is a copper layer or a copper alloy layer.

Figure 8:
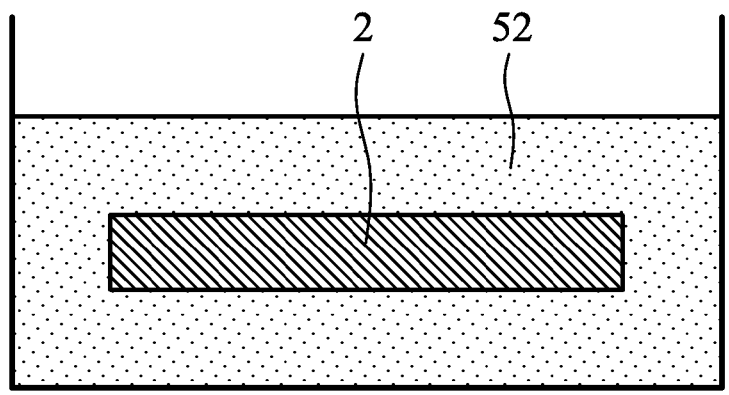
FIG. 8 illustrates an activation treatment process performed on a wafer.

Referring to FIG. 8, after the formation of first metallic layer 50, an activation treatment is performed. In an embodiment, activation treatment solution 52, as shown in FIG. 8, comprises de-ionized (DI) water and additional additives dissolved therein. The additives may include a treatment agent, such as an acid or other chemicals, that may activate and clean the surface of first metallic layer 50. In an exemplary embodiment, the treatment agent in activation treatment solution 52 comprises CX100, which may comprise about 30% citric acid ($C_6H_8O_7$). The treatment agent may also comprise HF, oxalic acid, $HNO_3$, HCl, $NH_4OH$, $H_2SO_4$, and/or the like. The weight percentage of the treatment agent may range between about 1 percent to about 40 percent. In the activation treatment, a temperature of treatment solution 52 may be between about 25° C. and about 50° C. During the activation treatment, the surface of first metallic layer 50 is cleaned, and any oxide, such as copper oxide, at the surface of first metallic layer 50 is removed.

Figure 5:
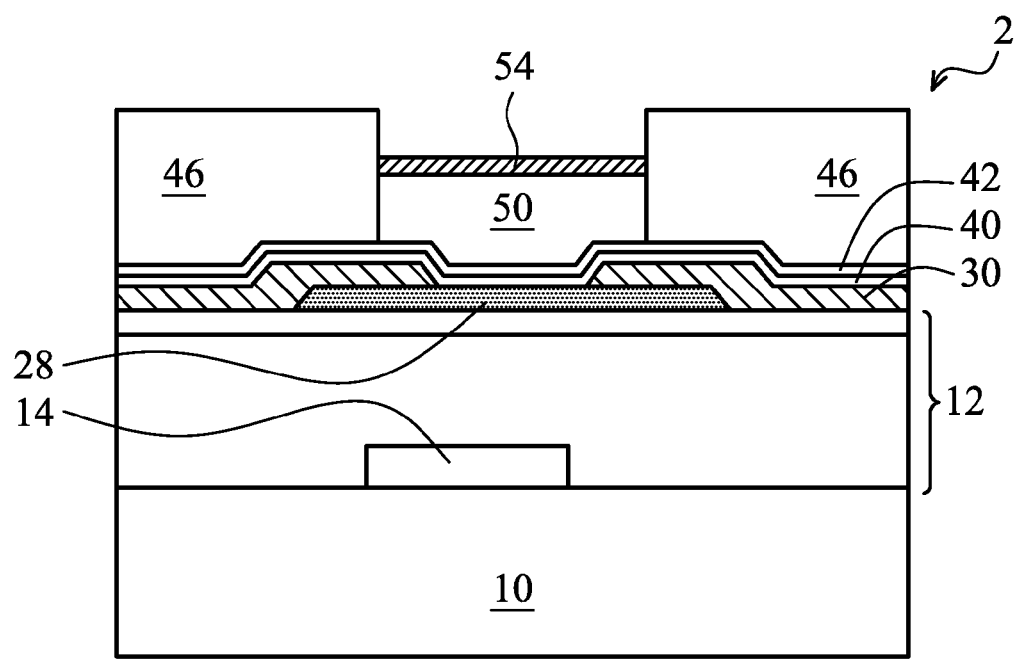

Next, as shown in FIG. 5, second metallic layer 54 is formed on the surface of first metallic layer 50, wherein the formation method may also be an electro-plating, an electroless-plating, an immersion plating, or the like. In an exemplary embodiment, second metallic layer 54 is a nickel layer. Next, a second activation treatment is performed on the surface of second metallic layer 54 in an activation treatment solution, which may be essentially the same as treatment solution 52 shown in FIG. 8. Similarly, the second activation treatment has the function of activating and cleaning the surface of second metallic layer 54 and removing oxide from the surface of second metallic layer 54.

Figure 6:
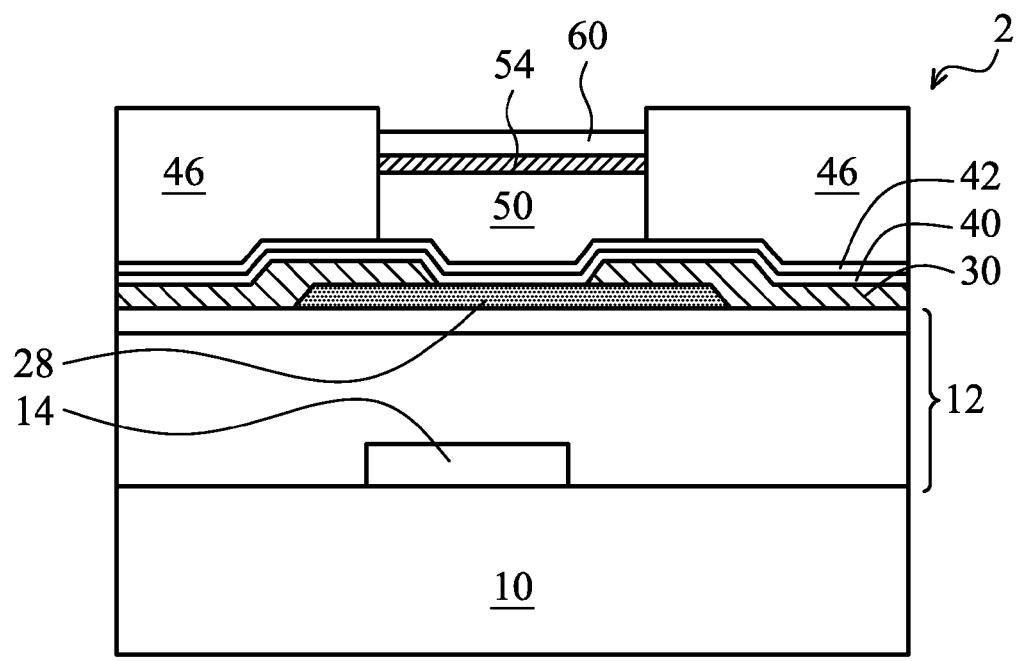

FIG. 6 illustrates the formation of third metallic layer 60 on the surface of second metallic layer 54, with the formation method including one of the electro-plating, electroless-plating, and immersion plating. Third metallic layer 60 may be a solder layer, which may be an eutectic solder or a lead-free solder. In an exemplary embodiment, the solder of third metallic layer 60 comprises zinc, silver, and copper, although other elements may also be used. Next, a third activation treatment is performed on the surface of third metallic layer 60 in an activation treatment solution, which may be essentially the same as the treatment solution 52 shown in FIG. 8.

Figure 7:
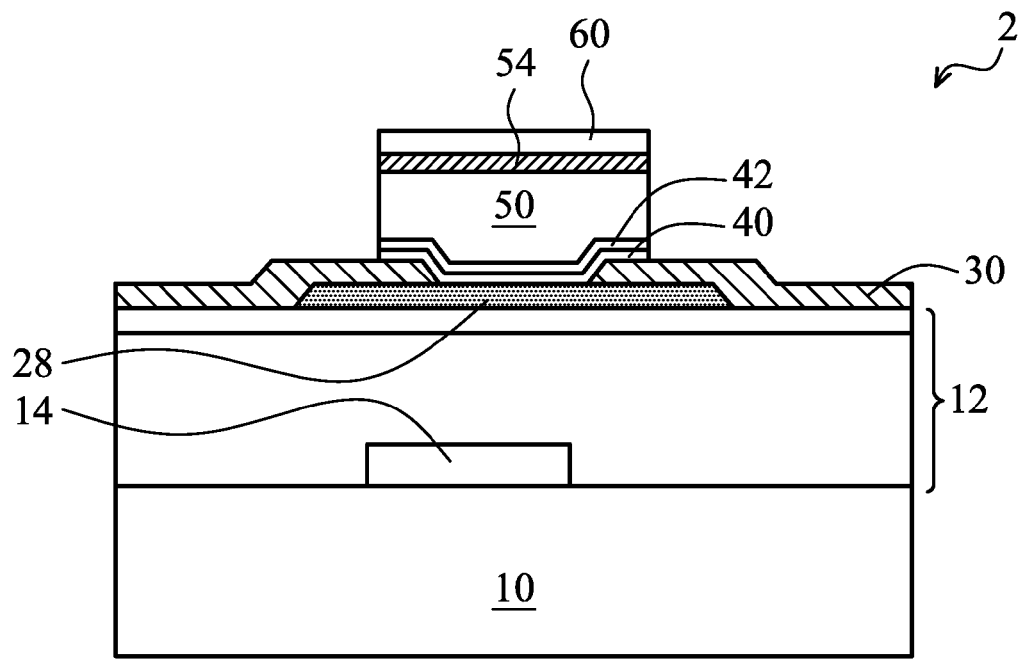

After the formation of third metallic layer 60, mask 46 is removed, and the portion of UBM 40/42 previously covered by mask 46 is also removed, for example, by an etch. The resulting structure is shown in FIG. 7.

It is realized that although the exemplary embodiments use the formation of metal bumps on the surface of a substrate as examples, the teaching is readily applicable to plating processes for forming other metallic features.

Experiments have shown that by using the embodiments, the interfaces between different layers are significantly improved, and a significant reduction in voids has been observed. Further, the interfaces become much smoother. As a result, the electro-migration (EM) performance, and hence the reliability, of the resulting metal bumps is also improved over conventional metal bumps that are formed with quick dump rinse (QDR) between plating processes.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a device comprising:
   performing a first plating process to form a first metallic feature comprising copper;
   performing a first activation treatment to a surface of the first metallic feature in a first activation treatment solution comprising a first treatment agent in de-ionized (DI) water;
   after the step of performing the first activation treatment, performing a second plating process to form a second metallic feature and contacting the surface of the first metallic feature, wherein the second metallic feature comprises nickel;
   after the step of performing the second plating process, performing a second activation treatment on a surface of the second metallic feature in a second activation treatment solution comprising a second treatment agent in DI water; and
   after the step of performing the second activation treatment, performing a third plating process to form a third metal feature contacting the surface of the second metallic feature, wherein the third metallic feature comprises a solder layer.

2. The method of claim 1, wherein the first treatment agent comprises an acid.

3. The method of claim 2, wherein the first treatment agent comprises CX100 comprising citric acid ($C_6H_8O_7$).

4. The method of claim 1, wherein a weight percentage of the first treatment agent in the first activation treatment solution is between about 1 percent and about 40 percent.

5. The method of claim 1, wherein the first, the second, and the third metallic features form a metal bump at a surface of a wafer comprising integrated circuits therein.

6. The method of claim 1, wherein the first and the second plating processes are selected from the group consisting essentially of electro-plating, electroless-plating, and immersion plating.

7. A method of forming a device comprising:
   providing a substrate;
   forming an under-bump metallurgy (UBM) over the substrate, wherein the UBM is conductive;
   forming and patterning a mask over the UBM, with a portion of the UBM exposed through an opening in the mask;
   performing a first plating process to form a copper layer over and aligned to the portion of the UBM exposed through the opening;
   performing a first activation treatment to a surface of the copper layer in a first activation treatment solution comprising a treatment agent in de-ionized (DI) water;
   after the step of performing the first activation treatment, performing a second plating process to form a nickel layer on the surface of the copper layer;
   after the step of performing the second plating process, performing a second activation treatment to a surface of the nickel layer in a second activation treatment solution comprising the treatment agent in DI water; and
   after the step of performing the second activation treatment, performing a third plating process to form a solder layer on the surface of the nickel layer.

8. The method of claim 7, wherein the treatment agent comprises citric acid ($C_6H_8O_7$).

9. The method of claim 7, wherein weight percentages of the treatment agent in the first and the second activation treatment solutions are between about 1 percent and about 40 percent.

10. The method of claim 7 further comprising:
    after the step of performing the third plating process, performing a third activation treatment to a surface of the solder layer in a third activation treatment solution comprising the treatment agent in DI water; and
    removing the mask and portions of the UBM directly under, and aligned to, the mask.

11. The method of claim 7, wherein the first, the second, and the third plating processes are selected from the group consisting essentially of electro-plating, electroless-plating plating, and immersion plating.

\* \* \* \* \*